US010271425B1

(12) United States Patent
Hassemer et al.

(10) Patent No.: US 10,271,425 B1
(45) Date of Patent: Apr. 23, 2019

(54) INTEGRATING A SENSOR INTO A FLEXIBLE DISPLAY CIRCUIT

(71) Applicant: Google LLC, Mountain View, CA (US)

(72) Inventors: Brian Jon Hassemer, Gurnee, IL (US); David Kyungtag Lim, Glenview, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/006,425

(22) Filed: Jun. 12, 2018

(51) Int. Cl.
| | | |
|---|---|---|
| *G06F 1/16* | (2006.01) | |
| *G06K 9/00* | (2006.01) | |
| *H05K 1/02* | (2006.01) | |
| *G02F 1/1345* | (2006.01) | |
| *G06F 3/044* | (2006.01) | |

(52) U.S. Cl.
CPC ......... *H05K 1/028* (2013.01); *G02F 1/13452* (2013.01); *G06F 1/1637* (2013.01); *G06F 1/1656* (2013.01); *G06F 3/044* (2013.01); *G06K 9/00013* (2013.01); *G06F 2203/04102* (2013.01); *H05K 2201/056* (2013.01)

(58) Field of Classification Search
CPC ..... H05K 1/028; G06F 1/1637; G06F 1/1656; G02F 1/13452; G06K 9/00013
See application file for complete search history.

(56) References Cited

U.S. PATENT DOCUMENTS

| | | | | |
|---|---|---|---|---|
| 4,862,153 A | * | 8/1989 | Nakatani | ............. G02F 1/13452 345/80 |
| 5,986,726 A | * | 11/1999 | Murai | ............... G02F 1/133308 349/58 |
| 6,741,299 B2 | * | 5/2004 | Fukayama | ........ G02F 1/133308 349/58 |
| 7,292,290 B2 | * | 11/2007 | Miyagawa | ............ G06F 1/1601 349/58 |
| 7,348,964 B1 | | 3/2008 | Gettemy et al. | |
| 8,149,349 B2 | * | 4/2012 | Jang | .................. G02F 1/133308 349/58 |
| 8,269,731 B2 | | 9/2012 | Molne | |
| 8,724,038 B2 | | 5/2014 | Ganapathi et al. | |
| 9,622,391 B2 | * | 4/2017 | Lee | ..................... G02F 1/13452 |
| 9,891,733 B2 | * | 2/2018 | Jeon | ........................ G06F 3/041 |
| 2001/0010569 A1 | * | 8/2001 | Jin | .................... G02F 1/133308 349/58 |
| 2005/0088830 A1 | * | 4/2005 | Yumoto | .............. G02F 1/13452 361/749 |
| 2006/0139271 A1 | * | 6/2006 | Okuda | ............. G02F 1/133308 345/88 |
| 2006/0164817 A1 | * | 7/2006 | Yoshida | ............. H01L 31/0203 361/749 |

(Continued)

*Primary Examiner* — Adrian S Wilson

(74) *Attorney, Agent, or Firm* — Fish & Richardson P.C.

(57) ABSTRACT

Techniques, methods, systems, and other mechanisms are described for integrating a sensor into a flexible display circuit. In some implementations, a computing device includes a flexible printed circuit. The flexible printed circuit includes a first set of conductors that extend from a first end of the flexible printed circuit to a second end of the flexible printed circuit to connect a display layer of a display device to a processing device. The flexible printed circuit also includes a second set of conductors that at least partially define a sensor at a sensor portion of the flexible printed circuit that is between the first end of the flexible printed circuit and the second end of the flexible printed circuit.

23 Claims, 7 Drawing Sheets

(56) References Cited

U.S. PATENT DOCUMENTS

2011/0102567 A1 5/2011 Erhart
2013/0265256 A1 10/2013 Nathan et al.
2015/0036065 A1 2/2015 Yousefpor et al.
2016/0004899 A1 1/2016 Pi et al.

* cited by examiner

INTEGRATING A SENSOR INTO A FLEXIBLE DISPLAY CIRCUIT

TECHNICAL FIELD

This document relates to integrating a sensor into a flexible display circuit.

BACKGROUND

Touch input systems, which determine a location of an object or person touching a surface, can be utilized in a wide variety of applications and can require that a location of the touch input be determined with a high degree of accuracy. These devices are sometimes transparent and fitted directly over a computer display. For example, resistive touchscreens are touch-sensitive computing displays that are sometimes composed of two flexible materials coated with a resistive material and separated by an air gap or microdots.

Flexible electronics, also referred to as flex circuits, are used to assemble electronic circuits by mounting electronic devices on flexible plastic substrates, such as polyimide or transparent conductive polyester film. Flexible electronic assembles can be manufactured to conform to a desired shape, or to flex during use. Various etching techniques can be used to thin a silicon substrate to few tens of micrometers to provide reasonable flexibility.

SUMMARY

This document describes techniques, methods, systems, and other mechanisms for integrating a sensor into a flexible display circuit. Various types of computing devices include displays and processors that control presentation of content on the displays, and those processors are sometimes located remote from the display due to space considerations. In such circumstances, the display and the processor can be connected using a flexible printed circuit display connector, sometimes called a display flex.

The technologies described in this disclosure describe various manners in which a sensor may be integrated as part of the display flex. As an example, the display flex may wrap from a front portion of the display around a side of the display to a rear of the display and a location of a processor. A portion of the display flex that lies behind the display may form a sensor. The sensor may be a resistive touch sensor formed by two layers of conductive traces formed within the display flex spaced apart from each other. User contact with a portion of the transparent glass lens that covers the display, at a location of the sensor in the display flex, may push the layers of conductive traces to contact each other, activating the resistive touch sensor.

Such technologies provide various advantages. For example, a sensor integrated into a display flex can provide an additional user input mechanism for a computing device. Moreover, integrating a sensor into a display flex may save space over alternative sensor integration mechanisms. Specifically, a sensor integrated with a display flex may occupy less space than a sensor that is not integrated into the display flex because a non-integrated sensor may require separate conductors and may occupy more space (e.g., due to a thicker housing or larger interface). Furthermore, integrating a sensor into a display flex may require fewer components than alternative sensor integration mechanisms, which can provide advantages in assembly time, reliability, and bill of materials.

In one general aspect, a computing device includes a housing, a transparent lens coupled to the housing, a display device behind the transparent lens, a processing device configured to electrically communicate with the display device to generate visual presentations using the display device, and a flexible printed circuit that connects to the display layer of the display device at a first end of the flexible printed circuit. The display layer includes electronic components that define pixels of the display device, where at least one of the multiple layers of the display device defines an edge portion of the display device. The flexible printed circuit wraps from the display layer around the edge portion of the display device to behind the display device with respect to the transparent lens, and connects to the processing device using a second end of the flexible printed circuit. The flexible printed circuit includes a first set of conductors that extend from the first end of the flexible printed circuit to the second end of the flexible printed circuit to connect the display layer of the display device to the processing device. The flexible printed circuit also includes a second set of conductors that at least partially define a sensor at a sensor portion of the flexible printed circuit that is between the first end of the flexible printed circuit and the second end of the flexible printed circuit.

One or more implementations of the computing device can include the following optional features. For example, in some implementations, the display device is arranged parallel to the transparent lens and the side edge portion of the display device is orthogonal to a front surface of the display device.

In some implementations, the second set of conductors extend from the second end of the flexible printed circuit to the sensor portion of the flexible printed circuit.

In some implementations, the sensor portion of the flexible printed circuit at which the second set of conductors at least partially define the sensor is located behind the display device with respect to the transparent lens of the computing device.

In some implementations, a front-facing surface of the sensor portion of the flexible printed circuit contacts a rear-facing surface of the display device or layer behind the display device.

In some implementations, a rear-facing surface of the sensor portion of the flexible printed circuit contacts a front-facing surface of a component located behind the display device and the flexible printed circuit.

In some implementations, the multiple layers of the display device include a touch-sensitive layer of the display device. The flexible printed circuit includes a third set of conductors that extend from the first end of the flexible printed circuit to the second end of the flexible printed circuit to connect the touch-sensitive layer of the display device to the processing device or another processing device.

In some implementations, a major surface of the touch-sensitive layer of the display device is substantially a same size as a major surface of the display layer of the display device. A major surface of the sensor at the sensor portion of the flexible printed circuit is less than half a size of the major surface of the touch-sensitive layer.

In some implementations, the sensor includes two conductors separated from each other by a space. The two conductors are arranged to contact each other in response to pressure applied to at least one of the two conductors.

In some implementations, each of the two conductors is formed on a portion of a layer of the display device, the respective portion of the layer being oriented parallel to a front surface of the transparent lens.

In some implementations, the computing device is structured so that the two conductors are arranged to contact each other in response to pressure applied to the front surface of the transparent lens.

In some implementations, the flexible printed circuit includes a multi-layer printed circuit, and the sensor is formed among multiple layers of the flexible printed circuit.

In some implementations, the sensor portion of the flexible printed circuit includes a first portion of the flexible printed circuit that is bent over a second portion of the flexible printed circuit. The first portion of the flexible printed circuit includes a first conductor of the two conductors and the second portion of the flexible printed circuit including a second conductor of the two conductors.

In some implementations, the processing device or another processing device is configured to determine whether the sensor that is at least partially defined by the second set of conductors has been pressed by applying a voltage to a first conductor of the two conductors and measuring a voltage present at the second conductor of the two conductors.

In some implementations, the first set of conductors and the second set of conductors are bonded to a flexible substrate of the flexible printed circuit In some implementations, the display device includes a light emitting diode (LED) display device and the display layer comprises a grid of LEDs that define the pixels of the display device. Alternatively, the display device includes a liquid crystal display (LCD) display device and the display layer includes liquid crystals sandwiched between two layers of glass.

In another general aspect, a flexible printed circuit includes a first set of conductors that extend from a first end of the flexible printed circuit to a second end of the flexible printed circuit and a second set of conductors. The second set of conductors at least partially define or connect to a sensor at a sensor portion of the flexible printed circuit that is between the first end of the flexible printed circuit and the second end of the flexible printed circuit. The second set of conductors also extend from the second end of the flexible printed circuit to the sensor portion of the flexible printed circuit. The flexible printed circuit also includes a first interface at the first end of the flexible printed circuit that is configured to connect the first set of conductors to a display device and a second interface at the second end of the flexible printed circuit that is configured to connect the first set of conductors to a processing device for electrical communication with the display device to generate visual presentations using the display device.

One or more implementations of the flexible printed circuit can have the following optional features. For example, in some implementations, the first interface at the first end of the flexible printed circuit is configured to connect to a display layer of the display device. The display layer includes electronic components that define pixels of the display device.

In some implementations, the second set of conductors connect to the sensor at the sensor portion of the flexible printed circuit.

In some implementations, a front-facing surface of the sensor portion of the flexible printed circuit is configured to contact a rear-facing surface of the display device or layer behind the display device. A rear-facing surface of the sensor portion of the flexible printed circuit is configured to contact a front-facing surface of a component located behind the display device and the flexible printed circuit.

In some implementations, the sensor includes two conductors separated from each other by a space. The conductors are configured to be arranged to contact each other in response to pressure applied to at least one of the two conductors.

In some implementations, each of the two conductors is formed on a portion of a layer of the display device. The respective portion of the layer is oriented parallel to the display device.

In some implementations, the flexible printed circuit or a component to which it attaches is configured to wrap around at least part of an edge portion of the display device to connect to a display layer of the display device that includes electronic components that define pixels of the display device.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
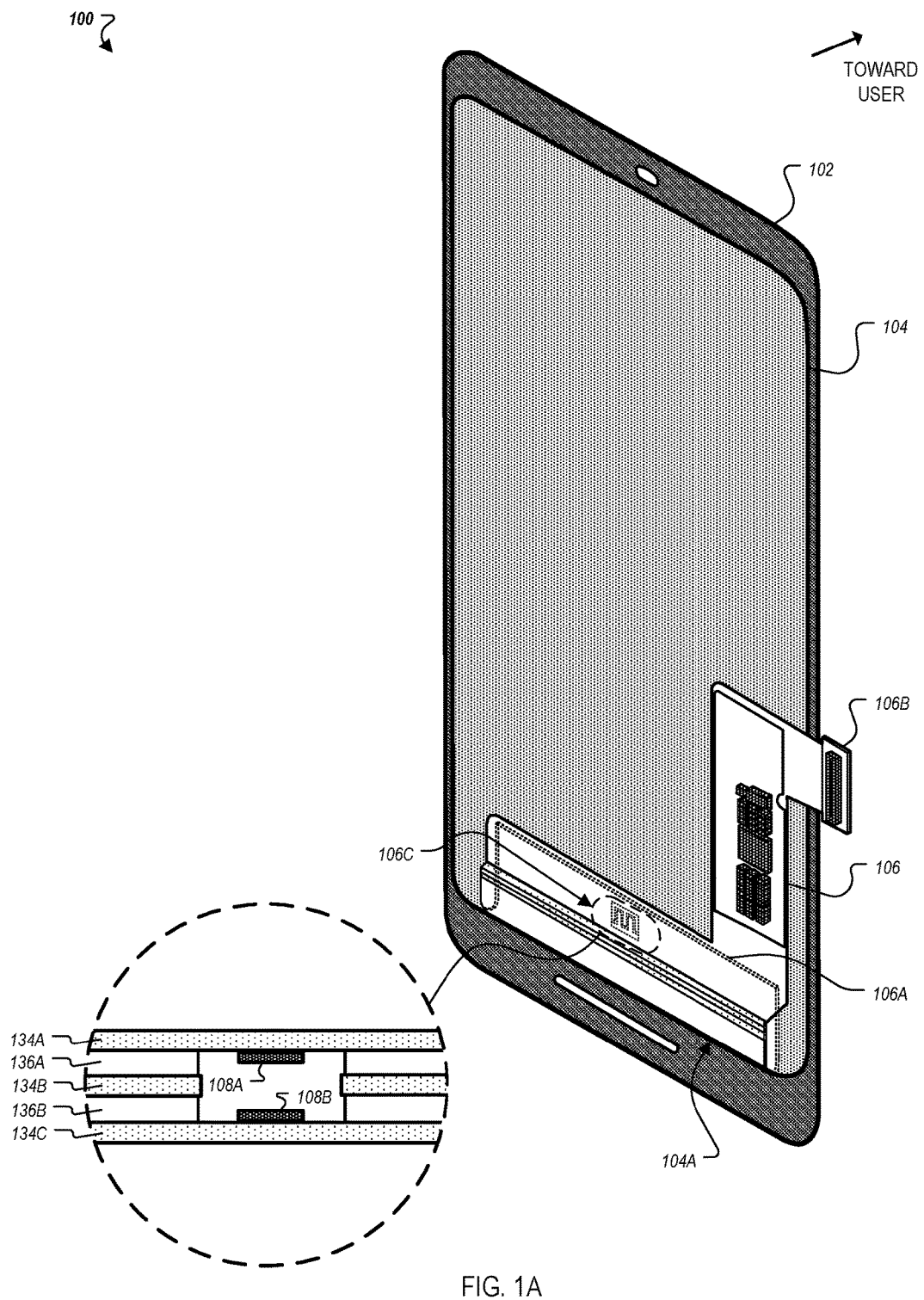
FIG. 1A is a perspective view of certain components of a computing device that includes a multi-layered display flex with an integrated sensor.

This document describes technologies that integrate a sensor into a display flex. Various types of displays include a layer of electronic components that define the pixels of the display, such as light emitting diodes (LEDs) in organic LED displays or transistors in active liquid crystal display (LCD) screens. The LEDs and transistors may be activated in various patterns to present content on the displays, and the content presented on the displays may be controlled by a processor of the computing device. The component that transmits electrical signals from the processor to the display layer is sometimes a display flex.

It is beneficial to use a display flex in some computing device designs because display flexes can be thin and the connector between the processor and the display layer of the display device may have to wrap around at least a part of the edge of the display device. The LEDs or transistors may be supported by or formed on a front surface of a layer of the display device, and therefore the interface to which communication conductors must attach may also be located on the front surface of that layer (e.g., the front surface of a polyamide layer in OLED displays, or the front surface of a glass layer in LCD displays). Indeed, driving circuitry, such as a display driver integrated circuit, is sometimes located on the front surface of that layer. When the processor is located behind the display device, the communication conductors may wrap from the display layer of the display device around a side of at least part of the display device to the processor behind the display device.

In such an arrangement, the display flex runs along the back surface of the display, which also provides an advantageous surface at which to integrate one or more sensors. As a non-limiting example, a resistive touch sensor may be implemented in a portion of the display flex using two layers of conductors that are spaced apart from each other but able to be pushed into contact with each other. A voltage gradient may be applied across a conductor of the first layer, and the voltage may be measured at a conductor of the second layer. Pressing the first layer into the second layer (or vice versa) may cause the two conductors to contact, and the point of contact may form a circuit that resembles a voltage divider. Electronics measuring the voltage present at the second layer may be able to correlate the measured voltage to a location of the contact. In some examples, the process can be repeated by applying voltage to the second layer and measuring the voltage present at the first layer in order to identify the location of contact with additional specificity (e.g., in a second dimension).

The layers of conductors that form the sensor may be integrated within the display flex, and the conductive communication lines that connect the sensor to the processor or another processor that monitors the sensor may also route through the display flex. Indeed, the communication conductors and the conductors that form the sensor may be integral.

One manner in which to form a resistive touch sensor in the display flex is to use a display flex that has multiple layers and to form the different conductive layers in different layers of the display flex, for example, with air gaps between some of the layers. Another manner in which to form a resistive touch sensor in a display flex is to bend part of the display flex over top of another portion of the display flex (e.g., in a display flex that has a single layer of conductors), so that a layer of conductors in the bent portion of the display flex is oriented over a layer of conductors in the non-bent portion of the display flex.

In either of the touch sensor implementations described above, the sensor portion of the display flex may be sandwiched between a back of the display device and a component behind the display device, so that force that is applied to the transparent lens that covers the display device pushes a first conductive layer of the sensor into a second conductive layer of the sensor, rather than simply moving the entire sensor away from the point of contact.

In some implementations, rather than the sensor being formed within the display flex at the sensor portion of the display flex, the display flex integrates a separately-manufactured sensor into the display flex at the sensor portion using an interface at the sensor portion of the flex. The interface may include multiple contact pads or multiple terminals for multiple respective conductors of the display flex, with the multiple contact pads or the multiple terminals being located on a major face of the display flex spaced apart from all edges of the display flex (e.g., so that the sensor attaches to a rear face of the display flex and is sandwiched between the display flex and a component arranged behind the display device and the display flex).

The technologies described in this disclosure can enable a computing device to recognize not only a location of contact with a portion of a display device, but additionally or alternatively a level of pressure at the location of contact, and may implement such benefits in a space-efficient manner. The remainder of this disclosure describes further details and advantages to such technologies with reference to the figures.

Figure 1B:
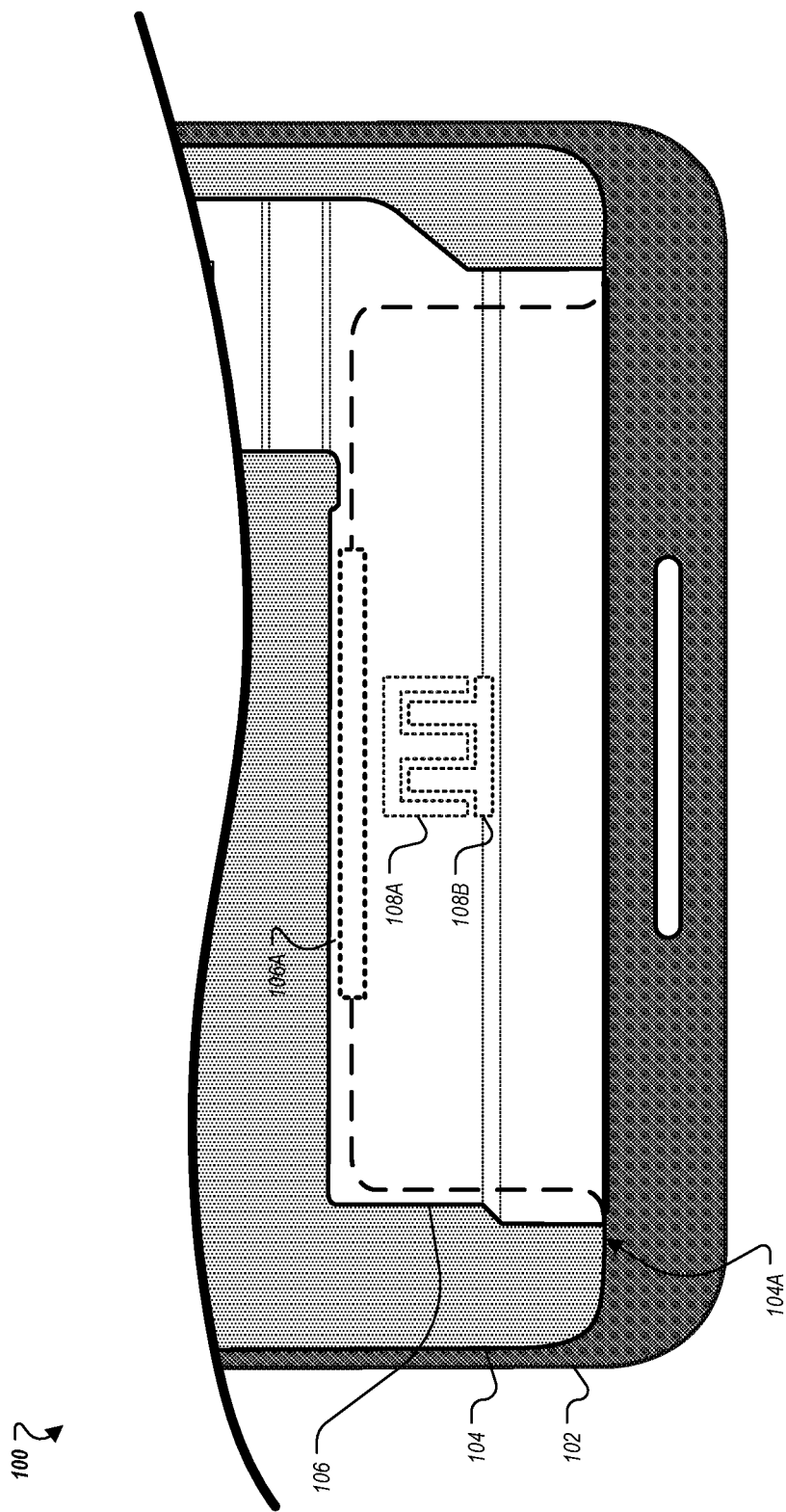
FIG. 1B is a partial plan view of the components shown in FIG. 1A.
Figure 1C:
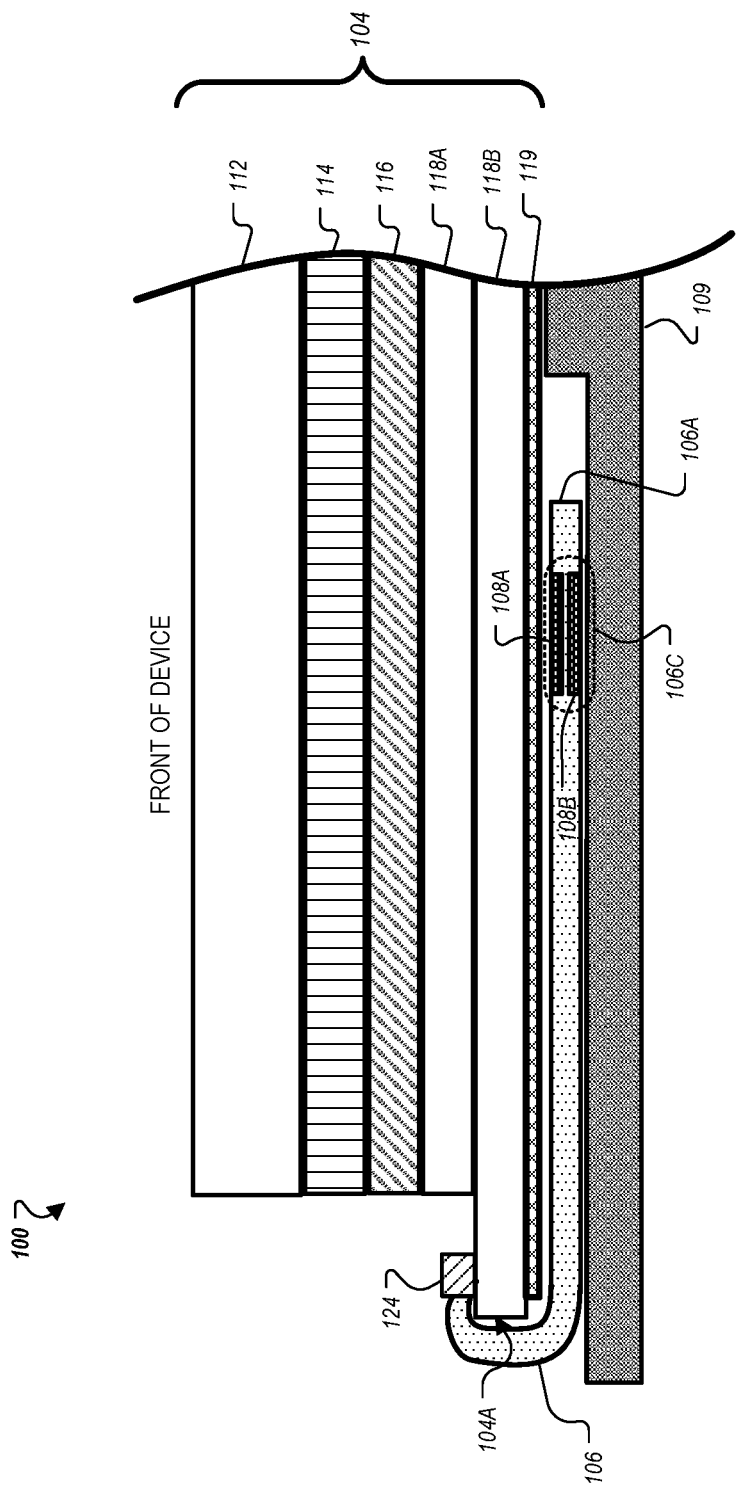
FIG. 1C is a partial side view of components shown in FIG. 1A.

FIGS. 1A-C depict a computing device 100 that includes a multi-layered display flex 106 with an integrated sensor 108. Referring initially to FIGS. 1A and 1B, perspective and plan views of certain components of the computing device 100 are shown. The components illustrated in FIG. 1A include a transparent lens 102, a display device 104, and a display flex 106, however, the computing device 100 can include other hardware components, such as one or more processing devices, speakers, microphones, cameras, light-emitting diodes (LEDs), batteries, random access memory (RAM) modules, and input/output (IO) ports, which are omitted from FIG. 1A for simplicity and clarity.

The computing device 100 can be any type of portal electronic computing device that has a display and allows a user to provide input through the display using an object or human touch input. As examples, the computing device 100 can be a smartphone, a mobile phone, a tablet computing device, a laptop computing device, or a smart wearable device, among others. Additionally, while a rectangular display device is shown in FIGS. 1A and 1B, in some implementations, the computing device 100 can have other shapes of display devices, such as circular display devices, oval-shaped display devices, or rectangular display devices with rounded corners.

The computing device can have a transparent lens 102 on a front side that faces a user and which is arranged in parallel and in front of the display device 104. The transparent lens 102 is coupled to a housing (e.g., an enclosure) 109 (shown in FIG. 1C) of the computing device 100 that contains and/or encloses other electronic components, such as a battery, speakers, communication modules, or power modules, among others. The housing 109 can be constructed from plastic, or alternatively, from glass as discussed below.

The display device 104 includes electronic components that define pixels of the display device 104. Specifically, the display device 104 includes multiple layers, for example, as shown in more detail in FIG. 1C, including a display layer with electronic components that define pixels of the display device 104. Each electronic component may define an entire pixel, or may define a sub-pixel such that multiple electronic components define a pixel.

Figure 2:
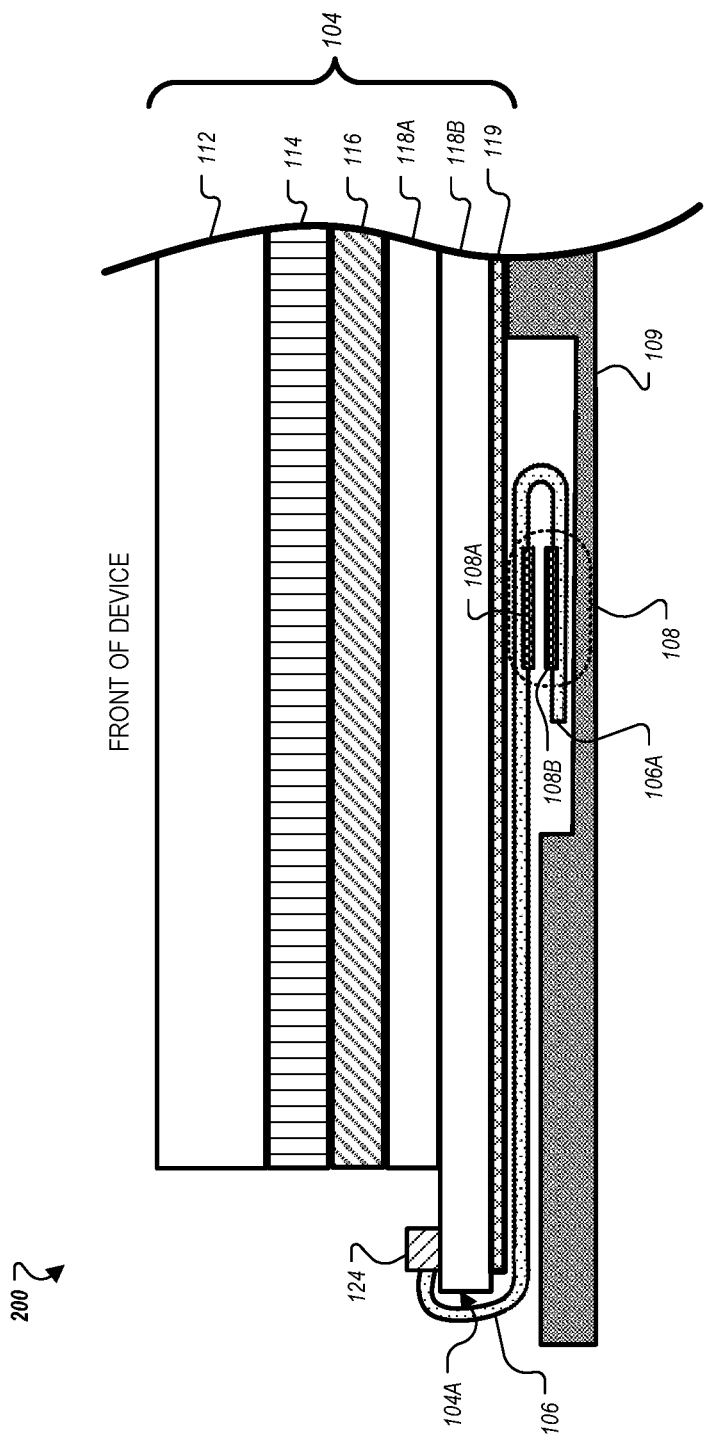
FIGS. 2-3 are partial side views of implementations of computing devices that include a single layer display flex with an integrated sensor.
Figure 3:
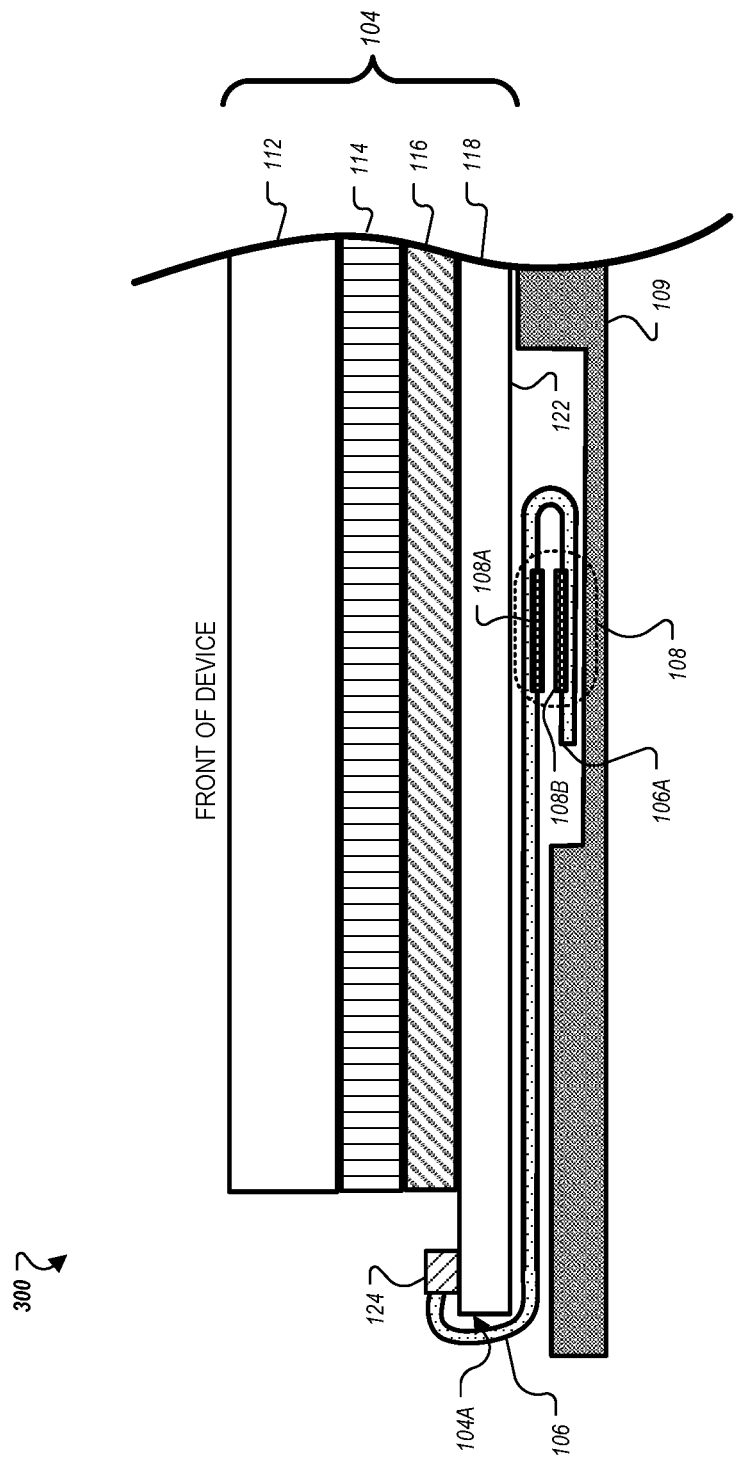

The display device 104, in various implementations, can employ different types of display technologies, such as a liquid-crystal display (LCD) (e.g., active matrix LCD, reflective and transflective LCD, cholesteric liquid crystal display (ch-LCD), or memory-LCD), ElectroPhoretic Display (EPD), Organic Light Emitting Diode (OLED), Mirasol (IMOD), Electrowetting Display (EWD), or Quick-Response Liquid Powder Display (QR-LPD). As non-limiting examples, FIG. 2 depicts an implementation in which a display device employs LCD technology, and FIG. 3 depict an implementation in which a display device employs OLED technology. The multiple layers of the display device 104 are depicted in FIG. 1C and discussed in more detail below.

The display flex 106 is a flexible printed circuit that includes one or more conducive elements bonded or otherwise attached to a dialectic film to enable transmission of signals between electronic components of the computing device. As discussed below, the display flex 106 can be used to provide electric communications between the display device 104 and a processor of the computing device 100 (not shown) to, for example, enable visual presentations using the display device 104 based on instructions received from the processing device. For example, the processing device can transmit instructions to the display layer of the display device 104 to generate a user interface that identifies content with which a user can interact by providing touch input detected by resistive and/or capacitive sensors associated with the display device 104.

The display flex 106 has a first end 106A that is configured to connect to the display device 104 and a second end 106B that is configured to connect to a processing device (not shown in FIGS. 1A-C). The display flex 106, in this example, wraps around an edge portion 104A of the display device 104 to behind the display device 104. Conductive elements extend from the first end 106A to the second end 106B to connect the display device 104 and the processing device of the computing device 100.

In some implementations, the first end 106A and the second end 106B of the display flex 106 are configured to interfaces that allow the display flex 106 to be connected to the display device 104 and the processing device, respectively. As non-limiting examples, interfaces connected to the first end 106A and second end 106B can be detachable terminals, conductive pads, plugs, jacks, connectors, or any other suitable means to join two lengths of flexible copper wire or cable, or to connect a wire or cable to an electrical terminal. In some instances, the interfaces are physical interfaces that connect wires mechanically and allow the ability to connect and disconnect the display flex 106 from the display device 104 and the processor device of the computing device 100.

The display flex 106 can be configured differently in various implementations. For example, the display flex 106 can be single layer flex that is comprised of a flexible polyimide film laminated to a thin sheet of copper. The copper layer can be chemically etched to produce a certain circuit pattern. A polyimide overlay may be added to the flex for insulation and environmental protection of the circuit pattern. In some implementations, the display flex 106 is a dual access flex circuit that is manufactured such that conductive material can be accessed from both sides of the circuit.

In some implementations, the display flex 106 is a double sided flex circuit that has two conductive layers, each on a different side of a base layer of polyimide. In such implementations, the display flex 106 can include trace patterns that are created on both sides of the polyimide and connected to each other at desired locations with copper plated through-holes. The plated through-holes can make electrical connections between the two layers.

Additionally, in other implementations, the display flex 106 is a multi-layer flex circuit that combines several single-sided or double-sided circuits with interconnections, shielding, and/or surface mounted technologies in a multi-layer design. The multiple layers may or may not be continuously laminated together throughout a production process. For example, continuous lamination may not be used in certain instances where maximum flexibility is desired for the display flex 106. A multi-layer flex circuit can be used to reduce unavoidable crossovers, specific impedance requirements, eliminate crosstalk, provide additional shielding, and allow high component density.

The display flex 106 includes a sensor portion 106C between the first end 106A and the second end 106B at which a sensor is integrated. As described herein, various manners can be used to integrate sensors into the sensor portion 106C depending on the construction and/or configuration of the display flex 106.

In the example depicted in FIGS. 1A-C, the display flex 106 is a multi-layer flex circuit. As shown in FIG. 1A, the display flex 106 includes three layers 134A, 134B, and 134C that are laminated together using adhesive layers 136A and 136B. In this example, the sensor portion 106C includes a sensor that is formed among the layers 134A and 134C of the display flex 106 (which may form outer layers 134A, 134C of the display flex 106). Specifically, the sensor includes two conductors 108A and 108B, with conductor 108A formed on the layer 134A and conductor 108B formed on the layer 134C, and separated from each other by a space. Pressure can be applied to a front surface of the transparent lens 102, which then causes contraction of the multiple layers of the display flex 106 and results in the conductors 108A and 108B contacting each other to generate a signal by the sensor. In this manner, the conductors 108A and 108B are arranged to contact each other in response to pressure applied to the front surface of the transparent lens 102 (or another surface of the computing device 100 that a user may contact to provide touch input). More generally, the sensor includes two conductors that are spaced apart from each other so that they are separated by a space, the two conductors being arranged to contact each other in response to pressure applied to the sensor portion 106C.

While FIGS. 1A-C illustrate multiple conductive layers in a space formed between multiple layers of the display flex 106, similar actuations and sensing techniques as shown in FIG. 1A-C can be applied to other implementations in which the sensor is implementing using a single layer of a flex circuit, as discussed below in reference to implementations depicted in FIGS. 2 and 3.

Referring now to FIG. 1C, a partial side view of the computing device 100, including multiple layers of the display device 104, is shown. A transparent lens 112 is arranged parallel to and in front of the display device 104 (i.e., above the display device 104 along a direction facing a user).

In the example depicted in FIG. 1C, the display device 104 includes layers arranged behind the transparent lens 112, such as an optically clear adhesive (OCA) 114, a polarizer 116, glass layers 118A, 118B, and a back film 119. In this example, the display device 104 employs, for example, an LCD display layer to produce color or monochrome images.

The OCA 114 bonds the top layer of the display device 104 (i.e., the polarizer 116) to the transparent lens 112 during assembly of the computing device 100. The polarizer 116 polarizes light propagating from back film 119 and which passes through the glass layers 118A, 118B prior to reaching the transparent lens 112. The back film 119 can be an optical film that is used to gain light into desired viewer directions or reflective polarizing films that recycle polarized light that is absorbed by a the polarizer 116. The display device 104 also includes a display layer that includes electronic components defining pixels of the display device 104.

As shown in FIG. 1C, the display flex 106 includes a first end 106A that is configured to connect to a port 124 of the display device 104 and a second end 106B (shown in FIG. 1A) that connects to a processing device of the computing device 100. The display flex 106 wraps around an edge portion 104A of the display device 104 (e.g., a side of one or more layers of the display device 104) and then routes underneath a bottom surface of the display device 104 such that a portion of the display flex that includes the sensor portion 106C is sandwiched between the back film 119 and the housing 109. Because the conductors 108A and 108B within the display flex 106 can be used as an integrated sensor, the arrangement of components depicted in FIGS. 1A-C can be used to increase space efficiency by allowing less space to be used for overall device packaging. For example, touch sensors that may otherwise be separately electrically connected to a processor within the enclosure 109, such as fingerprint sensors and pressure sensors, can be integrated into the display flex 106 in a manner as shown in FIGS. 1A-C to reduce the amount of storage space required in the enclosure 109.

In some implementations, the multiple layers of the display device 104 includes a touch-sensitive layer that is configured to detect touch input provided by a user onto the transparent lens 112 of the housing 102. The touch-sensitive layer can be configured to detect contact with the transparent lens 112 by an object or a human touch input, or alternatively, use capacitive sensing to detect proximity of an object or a human finger near a front-facing surface of the transparent lens 112. In such implementations, the display flex 106 can include conductors that extend from the first end 106A to the second end 106b to connect the touch-sensitive layer of the display device 104 to a processor device of the computing device 100. In some instances, the major surface of the touch-sensitive layer is substantially the same size as a major surface of the display layer of the display device 104 such that the display of the computing device 100 can be used as a touch screen. For example, the computing device 100 can be a smartphone with a display such that substantially the entire area of the display can receive touch input.

The sensor integrated into the display flex 106 and comprised of the conductors 108A and 108b can be used to provide an additional user input mechanism for the computing device 100. For example, in some implementations, a processor device of the computing device 100 can apply a voltage to the conductor 108A and measure a voltage present at the conductor 108A to determine if user input has contacted the sensor. In this example, pressure placed on a region of the front-facing surface of the housing 102 above the sensor portion 106C of the display flex 106 causes the conductors 108A and 108b to come into contact with one another. Thus, if user input has pressed on a region of the transparent lens 102 that corresponds to a location of the sensor integrated into the display flex 106, then the conductor 108A will come into contact with the conductor 108b and a voltage applied to the conductor 108A by the processing device will match the voltage measured at the conductor 108B.

The display flex may include multiple such sensors, and the location or locations of the one or more sensors integrated into the display flex 106 can be adjusted relative to the coordinate axis of the display device 104 to enable one or more "hotspots" at which pressure and/or capacitance applied to the front-facing surface of the housing 102 results in activation of the respective integrated sensor. For example, the display flex 106 can be arranged such that the sensor portion 106C is placed underneath a bottom center position of a screen of the computing device 100. In this example, the display flex 106 can positioned underneath the display device 104 such that pressure applied to other areas of the device screen (i.e., top left corner, top right corner) do not cause the conductors 108A and 108B to contact one another, whereas pressure applied to the bottom center of the screen does cause the conductors 108A and 108b to contact one another, thereby enabling a user input mechanism relating to specific regions of a display and to certain types of user input. In examples in which a touch-sensitive layer of the display device 104 is configured to detect an area contacted by user input but not a force of that user input, the sensor 108 can provide a mechanism to measure a force of user input. Further, in a low-power mode of the computing device (e.g., a sleep mode), the touch-sensitive layer of the display device 104 may be deactivated while the sensor 108 may remain active.

The display flex 106 can be configured to allow different activation sensitivities associated with the sensor 108 integrated in the display flex 106. For example, the number of layers of the display flex 106 can be increased to extend the space between the conductors 108A and 108B, and thereby increase the amount of pressure needed to be applied to the front-facing surface of the housing 102 to cause the conductors 108A and 108B to contact each other. In other examples involving a display flex 106 that is a single layer flex circuit, a spacer can be introduced between folded portions of the display flex 106 to extend the space between the conductors 108A and 108B.

In some implementations, the relative proximity of conductors 108A and 108b can be measured by the processor device of the computing device 110 as a sensing mechanism to, for instance, distinguish between different types of input, or determine whether an input satisfies a threshold necessary to determine whether the sensor integrated into the display flex 106 has been activated. For example, a distance between the conductors 108A and 108B can be monitored and used to determine how hard a user has pressed the front-facing surface of the housing 102. As another example, a change in measured distance between the conductors 108A and 108B over time can be used to determine whether a user has provided a "long-press" type of input or a "short-press" type of input. In these examples, the sensing capabilities provided by the sensor integrated into the display flex 106 can be used as a supplement or a substitute to other sensing capabilities provided through the display device 104.

In some implementations, the conductor 108A on a first layer of the sensor 108 criss-cross a region of the sensor 108 primarily in a first dimension, routing only in an orthogonal, second dimension so that the back-and-forth arrangement of the conductor 108a does not layer on top of itself. The conductor 108B on the second layer of the sensor 108 may similarly criss-cross the region of the sensor 108 primarily in the second dimension, routing only in the first dimension so that the back-and-forth arrangement of the conductor 108b does not layer on top of itself. The computing device 100 may apply voltage to a first end of conductor 108A, creating a voltage bridge across the length of conductor 108A. User input that pushes the two layers together can allows the computing device 100 to sense, due to a voltage measured with conductor 108b, a location of the user contact in the second dimension as a proportion of the voltage applied to the first end of conductor 108A. The same process can be repeated by applying a voltage to a first end of conductor 108B and sensing a voltage measured using conductor 108B to determine a location of the user contact in the first dimension.

Referring now to FIG. 2, a partial side view of a computing device 200 that includes a single layer display flex is shown. In this implementation, a portion of the display flex 106 can be folded on top of one another portion of the display flex 106 such that the sensor portion 106C includes two or more overlapping layers of the display flex 106. Conductors 108A and 108b are therefore formed in different portions of the same layer of the display flex 106 so as to form multiple layers of conductors as discussed above in reference to FIGS. 1A-C. The folded bottom layer of the display flex 106 (i.e., a portion of the display flex 106 that is above the enclosure 109) has a second end 106B that is configured to be connected to the processing device of the computing device 200 in a similar manner as discussed above with respect to FIGS. 1A-C.

Referring now to FIG. 3, a partial side view of a computing device 300 that includes a single layer display flex is shown. In this implementation, the display flex 106 is structured and arranged in a similar manner as discussed above with respect to FIG. 2. However, in this implementations, instead of having glass layers and a back film, the display device 104 instead has an organic panel 118 that is used as a display layer to generate light produced by pixels of the display device 104. For example, the organic panel 118 can be made from organic light emitting diodes (OLED) that produce light when current is applied to them. The OLED can be arranged in various red, green, and blue configurations to produce a full range of colors. The organic panel 118 can be configured to implement different techniques to pass current to pixels. For example, the organic panel 118 can be configured to implement a passive wiring matrix (e.g., by providing current to an entire row of LEDs one at a time) or active wiring matrix (e.g., by using a capacitor and thin-film transistor network to allow each pixel to be driven individually at an appropriate voltage).

The organic panel 118 can be include, for example, a cathode layer, one or more organic active layers, a thin-film transistor layer, and a substrate. The substrate can be made of glass, or alternatively, of different types of plastic, such as polyethylene terephthalate (PET) or polyethylene naphthalate (PEN), or some other appropriate material.

In some implementations, the display flex 106 can connect to a discrete sensor that is placed and/or attached to the display flex 106 using, for example, an adhesive layer between the discrete sensor and a surface of the display flex 106. The discrete sensor can be a pressure sensor, an electrical sensor, a temperature sensor, a humidity sensor, among others. The discrete sensor can be placed in a specific location on the display flex. For example, the discrete sensor can be placed at the sensor portion 106C of the display flex 106 such that the discrete sensor is sandwiched between the display device 104 and the display flex 106. In other examples, the discrete sensor is placed underneath the display flex 106, e.g., at the sensor portion 106C, such that the discrete sensor is sandwiched between the display flex 106 and another component underneath the display flex, such as an electronic component placed on top of the housing 109 or the housing 109 itself.

In some implementations, the display flex 106 can be connected to an intermediate component at the first end 106A or the second end 106B that allows the display flex 106 to be connected to the display device 104 and the processor device of the computing device 100, respectively. For example, the intermediate component can be an enclosure that encloses a flexed portion of the display flex 104 that wraps around the edge portion 104A of the display device and is configured to be attached to a back-facing surface of the display device 104. In this example, the intermediate component can have one interface that physically connects to a first interface of the display flex 106 at the first end 106A, and another interface that physically connects an interface of the display device 104 to permit electrical communications between the display device 104 and the display flex 106. In some instances, intermediate components can be attached at both the first end 106A and the second end 106B of the display flex 106 to, for instance, enable the display flex 106 to be placed in different regions of the computing device 100. In such instances, the intermediate components can be used as conduits that provide electrical connections between the display device 104, the display flex 106, and the processor device of the computing device 100. As examples, the intermediate components can be other flexible printed circuits, rigid printed circuit boards, wires/connectors, enclosures, among other types of components.

Figure 4:
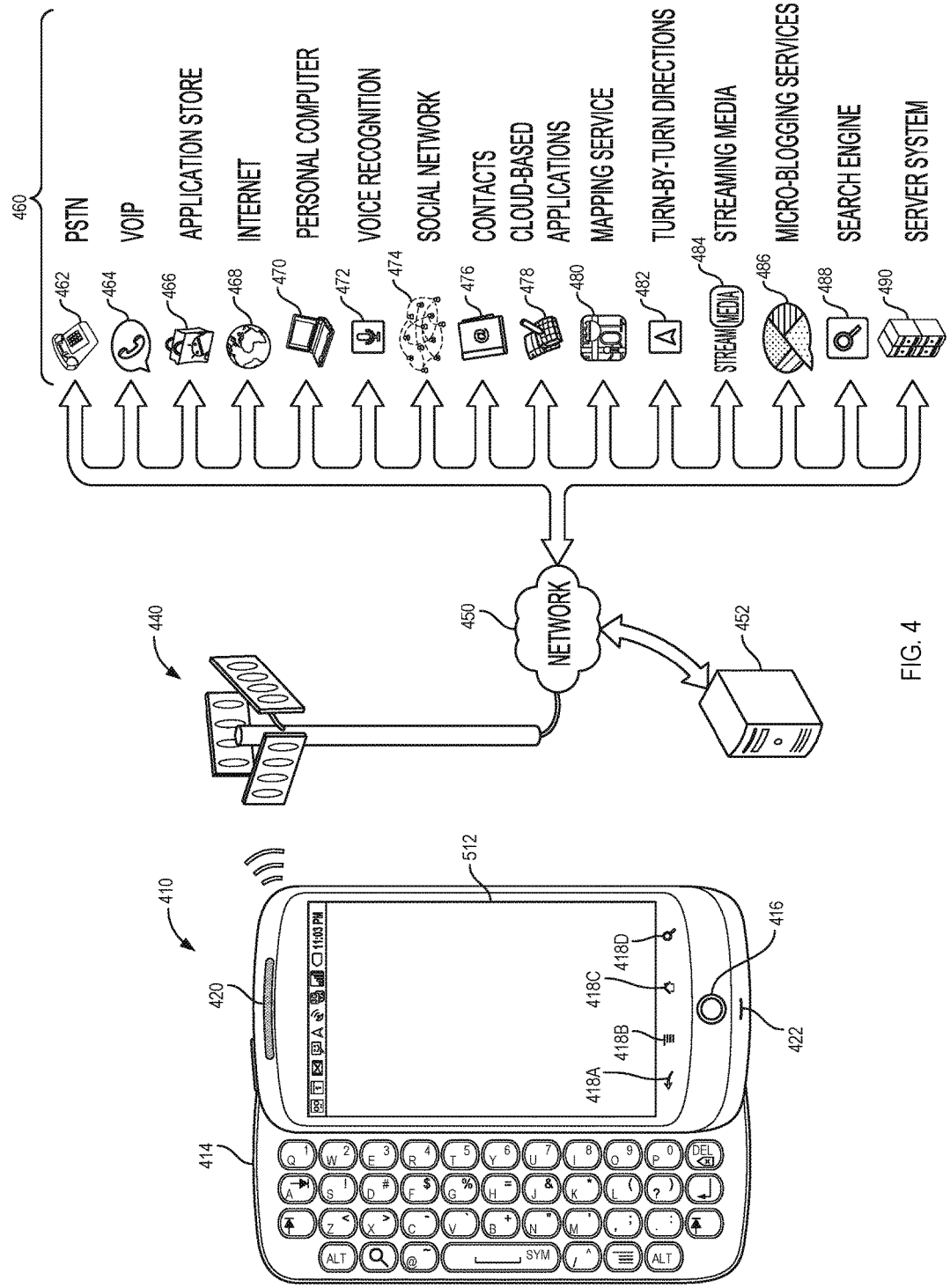
FIG. 4 is a conceptual diagram of a system that may be used to implement the systems and methods described in this document.

Referring now to FIG. 4, a conceptual diagram of a system that may be used to implement the systems and methods described in this document is illustrated. In the system, mobile computing device 410 can wirelessly communicate with base station 440, which can provide the mobile computing device wireless access to numerous hosted services 460 through a network 450.

In this illustration, the mobile computing device 410 is depicted as a handheld mobile telephone (e.g., a smartphone, or an application telephone) that includes a touchscreen display device 412 for presenting content to a user of the mobile computing device 410 and receiving touch-based user inputs. Other visual, tactile, and auditory output components may also be provided (e.g., LED lights, a vibrating mechanism for tactile output, or a speaker for providing tonal, voice-generated, or recorded output), as may various different input components (e.g., keyboard 414, physical buttons, trackballs, accelerometers, gyroscopes, and magnetometers).

Example visual output mechanism in the form of display device 412 may take the form of a display with resistive or capacitive touch capabilities. The display device may be for displaying video, graphics, images, and text, and for coordinating user touch input locations with the location of displayed information so that the device 410 can associate user contact at a location of a displayed item with the item. The mobile computing device 410 may also take alternative forms, including as a laptop computer, a tablet or slate computer, a personal digital assistant, an embedded system (e.g., a car navigation system), a desktop personal computer, or a computerized workstation.

An example mechanism for receiving user-input includes keyboard 414, which may be a full qwerty keyboard or a traditional keypad that includes keys for the digits '0-9', '*', and '#.' The keyboard 414 receives input when a user physically contacts or depresses a keyboard key. User manipulation of a trackball 416 or interaction with a track pad enables the user to supply directional and rate of movement information to the mobile computing device 410 (e.g., to manipulate a position of a cursor on the display device 412).

The mobile computing device 410 may be able to determine a position of physical contact with the touchscreen display device 412 (e.g., a position of contact by a finger or a stylus). Using the touchscreen 412, various "virtual" input mechanisms may be produced, where a user interacts with a graphical user interface element depicted on the touchscreen 412 by contacting the graphical user interface element. An example of a "virtual" input mechanism is a "software keyboard," where a keyboard is displayed on the touchscreen and a user selects keys by pressing a region of the touchscreen 412 that corresponds to each key.

The mobile computing device 410 may include mechanical or touch sensitive buttons 418a-d. Additionally, the mobile computing device may include buttons for adjusting volume output by the one or more speakers 420, and a button for turning the mobile computing device on or off. A microphone 422 allows the mobile computing device 410 to convert audible sounds into an electrical signal that may be digitally encoded and stored in computer-readable memory, or transmitted to another computing device. The mobile computing device 410 may also include a digital compass, an accelerometer, proximity sensors, and ambient light sensors.

An operating system may provide an interface between the mobile computing device's hardware (e.g., the input/output mechanisms and a processor executing instructions retrieved from computer-readable medium) and software. Example operating systems include ANDROID, CHROME, IOS, MAC OS X, WINDOWS 7, WINDOWS PHONE 7, SYMBIAN, BLACKBERRY, WEBOS, a variety of UNIX operating systems; or a proprietary operating system for computerized devices. The operating system may provide a platform for the execution of application programs that facilitate interaction between the computing device and a user.

The mobile computing device 410 may present a graphical user interface with the touchscreen 412. A graphical user interface is a collection of one or more graphical interface elements and may be static (e.g., the display appears to remain the same over a period of time), or may be dynamic (e.g., the graphical user interface includes graphical interface elements that animate without user input).

A graphical interface element may be text, lines, shapes, images, or combinations thereof. For example, a graphical interface element may be an icon that is displayed on the desktop and the text associated with the icon. In some examples, a graphical interface element is selectable with user-input. For example, a user may select a graphical interface element by pressing a region of the touchscreen that corresponds to a display of the graphical interface element. In some examples, the user may manipulate a trackball to highlight a single graphical interface element as having focus. User-selection of a graphical interface element may invoke a pre-defined action by the mobile computing device. In some examples, selectable graphical interface elements further or alternatively correspond to a button on the keyboard 404. User-selection of the button may invoke the pre-defined action.

In some examples, the operating system provides a "desktop" graphical user interface that is displayed after turning on the mobile computing device 410, after activating the mobile computing device 410 from a sleep state, after "unlocking" the mobile computing device 410, or after receiving user-selection of the "home" button 418c. The desktop graphical user interface may display several graphical interface elements that, when selected, invoke corresponding application programs. An invoked application program may present a graphical interface that replaces the desktop graphical user interface until the application program terminates or is hidden from view.

User-input may influence an executing sequence of mobile computing device 410 operations. For example, a single-action user input (e.g., a single tap of the touchscreen, swipe across the touchscreen, contact with a button, or combination of these occurring at a same time) may invoke an operation that changes a display of the user interface. Without the user-input, the user interface may not have changed at a particular time. For example, a multi-touch user input with the touchscreen 412 may invoke a mapping application to "zoom-in" on a location, even though the mapping application may have by default zoomed-in after several seconds.

The desktop graphical interface can also display "widgets." A widget is one or more graphical interface elements that are associated with an application program that is executing, and that display on the desktop content controlled by the executing application program. A widget's application program may launch as the mobile device turns on. Further, a widget may not take focus of the full display. Instead, a widget may only "own" a small portion of the desktop, displaying content and receiving touchscreen user-input within the portion of the desktop.

The mobile computing device 410 may include one or more location-identification mechanisms. A location-identification mechanism may include a collection of hardware and software that provides the operating system and application programs an estimate of the mobile device's geographical position. A location-identification mechanism may employ satellite-based positioning techniques, base station transmitting antenna identification, multiple base station triangulation, internet access point IP location determinations, inferential identification of a user's position based on search engine queries, and user-supplied identification of location (e.g., by receiving user a "check in" to a location).

The mobile computing device 410 may include other applications, computing sub-systems, and hardware. A call handling unit may receive an indication of an incoming telephone call and provide a user the capability to answer the incoming telephone call. A media player may allow a user to listen to music or play movies that are stored in local memory of the mobile computing device 410. The mobile device 410 may include a digital camera sensor, and corresponding image and video capture and editing software. An internet browser may enable the user to view content from a web page by typing in an addresses corresponding to the web page or selecting a link to the web page.

The mobile computing device 410 may include an antenna to wirelessly communicate information with the base station 440. The base station 440 may be one of many base stations in a collection of base stations (e.g., a mobile telephone cellular network) that enables the mobile computing device 410 to maintain communication with a network 450 as the mobile computing device is geographically moved. The computing device 410 may alternatively or additionally communicate with the network 450 through a Wi-Fi router or a wired connection (e.g., ETHERNET, USB, or FIREWIRE). The computing device 410 may also wirelessly communicate with other computing devices using BLUETOOTH protocols, or may employ an ad-hoc wireless network.

A service provider that operates the network of base stations may connect the mobile computing device 410 to the network 450 to enable communication between the mobile computing device 410 and other computing systems that provide services 460. Although the services 460 may be provided over different networks (e.g., the service provider's internal network, the Public Switched Telephone Network, and the Internet), network 450 is illustrated as a single network. The service provider may operate a server system 452 that routes information packets and voice data between the mobile computing device 410 and computing systems associated with the services 460.

The network 450 may connect the mobile computing device 410 to the Public Switched Telephone Network (PSTN) 462 in order to establish voice or fax communication between the mobile computing device 410 and another computing device. For example, the service provider server system 452 may receive an indication from the PSTN 462 of an incoming call for the mobile computing device 410. Conversely, the mobile computing device 410 may send a communication to the service provider server system 452 initiating a telephone call using a telephone number that is associated with a device accessible through the PSTN 462.

The network 450 may connect the mobile computing device 410 with a Voice over Internet Protocol (VoIP) service 464 that routes voice communications over an IP network, as opposed to the PSTN. For example, a user of the mobile computing device 410 may invoke a VoIP application and initiate a call using the program. The service provider server system 452 may forward voice data from the call to a VoIP service, which may route the call over the internet to a corresponding computing device, potentially using the PSTN for a final leg of the connection.

An application store 466 may provide a user of the mobile computing device 410 the ability to browse a list of remotely stored application programs that the user may download over the network 450 and install on the mobile computing device 410. The application store 466 may serve as a repository of applications developed by third-party application developers. An application program that is installed on the mobile computing device 410 may be able to communicate over the network 450 with server systems that are designated for the application program. For example, a VoIP application program may be downloaded from the Application Store 466, enabling the user to communicate with the VoIP service 464.

The mobile computing device 410 may access content on the internet 468 through network 450. For example, a user of the mobile computing device 410 may invoke a web browser application that requests data from remote computing devices that are accessible at designated universal resource locations. In various examples, some of the services 460 are accessible over the internet.

The mobile computing device may communicate with a personal computer 470. For example, the personal computer 470 may be the home computer for a user of the mobile computing device 410. Thus, the user may be able to stream media from his personal computer 470. The user may also view the file structure of his personal computer 470, and transmit selected documents between the computerized devices.

A voice recognition service 472 may receive voice communication data recorded with the mobile computing device's microphone 422, and translate the voice communication into corresponding textual data. In some examples, the translated text is provided to a search engine as a web query, and responsive search engine search results are transmitted to the mobile computing device 410.

The mobile computing device 410 may communicate with a social network 474. The social network may include numerous members, some of which have agreed to be related as acquaintances. Application programs on the mobile computing device 410 may access the social network 474 to retrieve information based on the acquaintances of the user of the mobile computing device. For example, an "address book" application program may retrieve telephone numbers for the user's acquaintances. In various examples, content may be delivered to the mobile computing device 410 based on social network distances from the user to other members in a social network graph of members and connecting relationships. For example, advertisement and news article content may be selected for the user based on a level of interaction with such content by members that are "close" to the user (e.g., members that are "friends" or "friends of friends").

The mobile computing device 410 may access a personal set of contacts 476 through network 450. Each contact may identify an individual and include information about that individual (e.g., a phone number, an email address, and a birthday). Because the set of contacts is hosted remotely to the mobile computing device 410, the user may access and maintain the contacts 476 across several devices as a common set of contacts.

The mobile computing device 410 may access cloud-based application programs 478. Cloud-computing provides application programs (e.g., a word processor or an email program) that are hosted remotely from the mobile computing device 410, and may be accessed by the device 410 using a web browser or a dedicated program. Example cloud-based application programs include GOOGLE DOCS word processor and spreadsheet service, GOOGLE GMAIL webmail service, and PICASA picture manager.

Mapping service 480 can provide the mobile computing device 410 with street maps, route planning information, and satellite images. An example mapping service is GOOGLE MAPS. The mapping service 480 may also receive queries and return location-specific results. For example, the mobile computing device 410 may send an estimated location of the mobile computing device and a user-entered query for "pizza places" to the mapping service 480. The mapping service 480 may return a street map with "markers" superimposed on the map that identify geographical locations of nearby "pizza places."

Turn-by-turn service 482 may provide the mobile computing device 410 with turn-by-turn directions to a user-supplied destination. For example, the turn-by-turn service 482 may stream to device 410 a street-level view of an estimated location of the device, along with data for providing audio commands and superimposing arrows that direct a user of the device 410 to the destination.

Various forms of streaming media 484 may be requested by the mobile computing device 410. For example, computing device 410 may request a stream for a pre-recorded video file, a live television program, or a live radio program. Example services that provide streaming media include YOUTUBE and PANDORA.

A micro-blogging service 486 may receive from the mobile computing device 410 a user-input post that does not identify recipients of the post. The micro-blogging service 486 may disseminate the post to other members of the micro-blogging service 486 that agreed to subscribe to the user.

A search engine 488 may receive user-entered textual or verbal queries from the mobile computing device 410, determine a set of internet-accessible documents that are responsive to the query, and provide to the device 410 information to display a list of search results for the responsive documents. In examples where a verbal query is received, the voice recognition service 472 may translate the received audio into a textual query that is sent to the search engine.

These and other services may be implemented in a server system 490. A server system may be a combination of hardware and software that provides a service or a set of services. For example, a set of physically separate and networked computerized devices may operate together as a logical server system unit to handle the operations necessary to offer a service to hundreds of computing devices. A server system is also referred to herein as a computing system.

In various implementations, operations that are performed "in response to" or "as a consequence of" another operation (e.g., a determination or an identification) are not performed if the prior operation is unsuccessful (e.g., if the determination was not performed). Operations that are performed "automatically" are operations that are performed without user intervention (e.g., intervening user input). Features in this document that are described with conditional language may describe implementations that are optional. In some examples, "transmitting" from a first device to a second device includes the first device placing data into a network for receipt by the second device, but may not include the second device receiving the data. Conversely, "receiving" from a first device may include receiving the data from a network, but may not include the first device transmitting the data.

"Determining" by a computing system can include the computing system requesting that another device perform the determination and supply the results to the computing system. Moreover, "displaying" or "presenting" by a computing system can include the computing system sending data for causing another device to display or present the referenced information.

Figure 5:
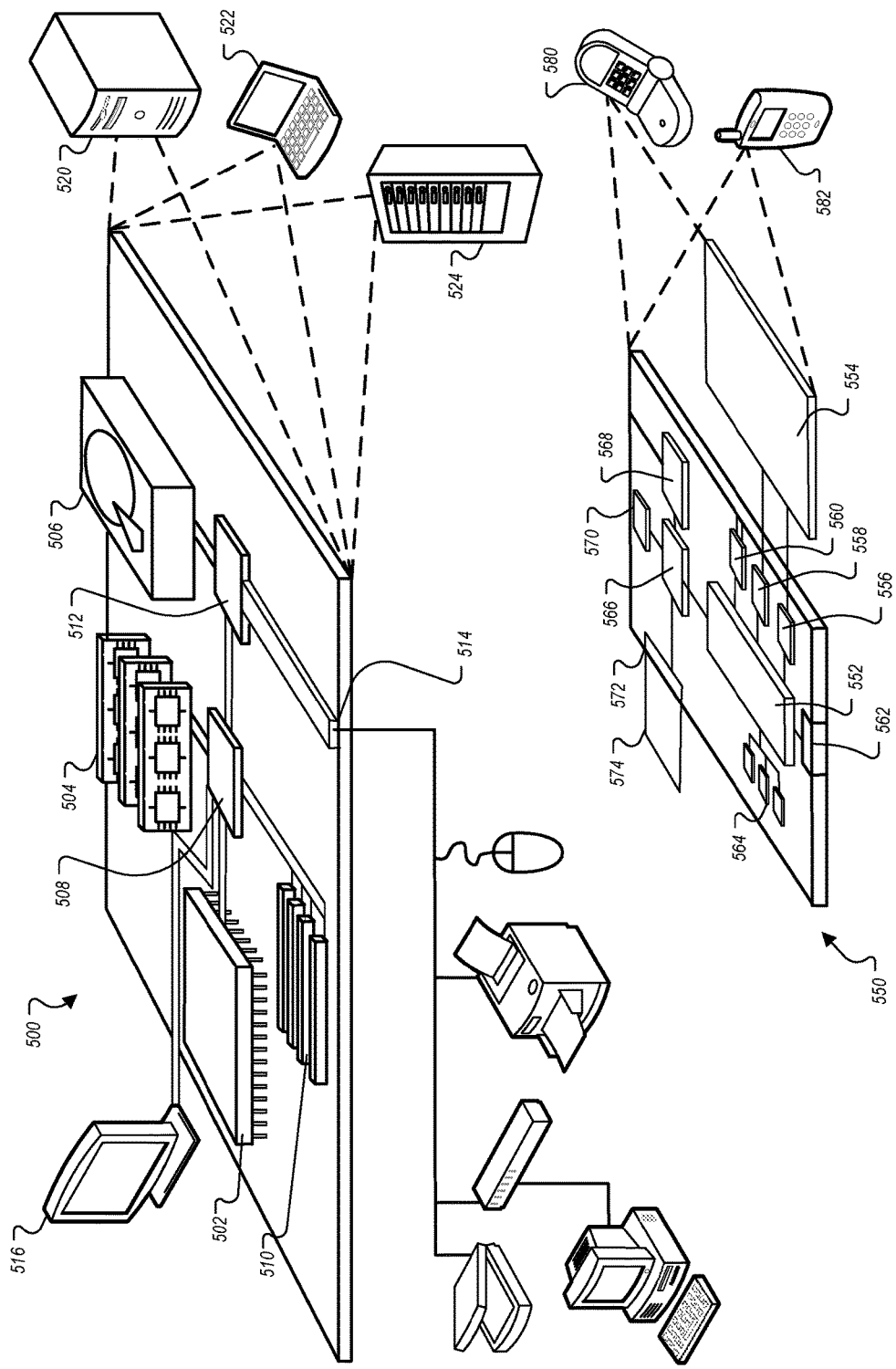
FIG. 5 is a block diagram of computing devices that may be used to implement the systems and methods described in this document, as either a client or as a server or plurality of servers.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, and other similar computing devices. The components shown here, their connections and relationships, and their functions, are meant to be examples only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high-speed interface 508. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 504 stores information within the computing device 500. In one implementation, the memory 504 is a volatile memory unit or units. In another implementation, the memory 504 is a non-volatile memory unit or units. The memory 504 may also be another form of computer-readable medium, such as a magnetic or optical disk.

The storage device 506 is capable of providing mass storage for the computing device 500. In one implementation, the storage device 506 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 504, the storage device 506, or memory on processor 502.

The high-speed controller 508 manages bandwidth-intensive operations for the computing device 500, while the low speed controller 512 manages lower bandwidth-intensive operations. Such allocation of functions is an example only. In one implementation, the high-speed controller 508 is coupled to memory 504, display 516 (e.g., through a graphics processor or accelerator), and to high-speed expansion ports 510, which may accept various expansion cards (not shown). In the implementation, low-speed controller 512 is coupled to storage device 506 and low-speed expansion port 514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can execute instructions within the computing device 550, including instructions stored in the memory 564. The processor may be implemented as a chipset of chips that include separate and multiple analog and digital processors. Additionally, the processor may be implemented using any of a number of architectures. For example, the processor may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT (Thin-Film-Transistor Liquid Crystal Display) display or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication in some implementations, or for wireless communication in other implementations, and multiple interfaces may also be used.

The memory 564 stores information within the computing device 550. The memory 564 can be implemented as one or more of a computer-readable medium or media, a volatile memory unit or units, or a non-volatile memory unit or units. Expansion memory 574 may also be provided and connected to device 550 through expansion interface 572, which may include, for example, a SIMM (Single In Line Memory Module) card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552 that may be received, for example, over transceiver 568 or external interface 562.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS (Global Positioning System) receiver module 570 may provide additional navigation- and location-related wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound (e.g., voice messages, music files, etc.) and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Additionally, computing device 500 or 550 can include Universal Serial Bus (USB) flash drives. The USB flash drives may store operating systems and other applications. The USB flash drives can include input/output components, such as a wireless transmitter or USB connector that may be inserted into a USB port of another computing device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. Moreover, other mechanisms for performing the systems and methods described in this document may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A computing device, comprising:
   a housing;
   a transparent lens coupled to the housing;
   a display device behind the transparent lens, the display device comprising multiple layers, including a display layer that comprises electronic components that define the pixels of the display device, wherein at least one of the multiple layers of the display device defines an edge portion of the display device;
   a processing device configured to electrically communicate with the display device to generate visual presentations using the display device; and
   a flexible printed circuit that connects to the display layer of the display device at a first end of the flexible printed circuit, wraps from the display layer around the edge portion of the display device to behind the display device with respect to the transparent lens, and connects to the processing device using a second end of the flexible printed circuit, the flexible printed circuit including:
   (i) a first set of conductors that extend from the first end of the flexible printed circuit to the second end of the flexible printed circuit to connect the display layer of the display device to the processing device, and
   (ii) a second set of conductors that at least partially define a sensor at a sensor portion of the flexible printed circuit that is between the first end of the flexible printed circuit and the second end of the flexible printed circuit.

2. The computing device of claim 1, wherein:
   the display device is arranged parallel to the transparent lens; and
   the side edge portion of the display device is orthogonal to a front surface of the display device.

3. The computing device of claim 1, wherein the second set of conductors extend from the second end of the flexible printed circuit to the sensor portion of the flexible printed circuit.

4. The computing device of claim 1, wherein the sensor portion of the flexible printed circuit at which the second set of conductors at least partially define the sensor is located behind the display device with respect to the transparent lens of the computing device.

5. The computing device of claim 4, wherein a front-facing surface of the sensor portion of the flexible printed circuit contacts a rear-facing surface of the display device or layer behind the display device.

6. The computing device of claim 5, wherein a rear-facing surface of the sensor portion of the flexible printed circuit contacts a front-facing surface of a component located behind the display device and the flexible printed circuit.

7. The computing device of claim 1, wherein:
   the multiple layers of the display device include a touch-sensitive layer of the display device; and
   the flexible printed circuit includes a third set of conductors that extend from the first end of the flexible printed circuit to the second end of the flexible printed circuit to connect the touch-sensitive layer of the display device to the processing device or another processing device.

8. The computing device of claim 7, wherein:
   a major surface of the touch-sensitive layer of the display device is substantially a same size as a major surface of the display layer of the display device; and
   a major surface of the sensor at the sensor portion of the flexible printed circuit is less than half a size of the major surface of the touch-sensitive layer.

9. The computing device of claim 1, wherein the sensor comprises two conductors separated from each other by a space, the two conductors arranged to contact each other in response to pressure applied to at least one of the two conductors.

10. The computing device of claim 9, wherein each of the two conductors is formed on a portion of a layer of the display device, the respective portion of the layer being oriented parallel to a front surface of the transparent lens.

11. The computing device of claim 9, wherein the computing device is structured so that the two conductors are arranged to contact each other in response to pressure applied to the front surface of the transparent lens.

12. The computing device of claim 9, wherein the flexible printed circuit comprises a multi-layer printed circuit, and the sensor is formed among multiple layers of the flexible printed circuit.

13. The computing device of claim 9, wherein the sensor portion of the flexible printed circuit comprises a first portion of the flexible printed circuit that is bent over a second portion of the flexible printed circuit, the first portion of the flexible printed circuit including a first conductor of the two conductors and the second portion of the flexible printed circuit including a second conductor of the two conductors.

14. The computing device of claim 13, wherein the processing device or another processing device is configured to determine whether the sensor that is at least partially defined by the second set of conductors has been pressed by applying a voltage to a first conductor of the two conductors and measuring a voltage present at the second conductor of the two conductors.

15. The computing device of claim 1, wherein the first set of conductors and the second set of conductors are bonded to a flexible substrate of the flexible printed circuit.

16. The computing device of claim 1, wherein:
   the display device comprises a light emitting diode (LED) display device and the display layer comprises a grid of LEDs that define the pixels of the display device; or
   the display device comprises a liquid crystal display (LCD) display device and the display layer comprises liquid crystals sandwiched between two layers of glass.

17. A flexible printed circuit, comprising:
   a first set of conductors that extend from a first end of the flexible printed circuit to a second end of the flexible printed circuit; and
   a second set of conductors that:
   (i) at least partially define or connect to a sensor at a sensor portion of the flexible printed circuit that is between the first end of the flexible printed circuit and the second end of the flexible printed circuit,
   (ii) extend from the second end of the flexible printed circuit to the sensor portion of the flexible printed circuit;
   a first interface at the first end of the flexible printed circuit that is configured to connect the first set of conductors to a display device; and a second interface at the second end of the flexible printed circuit that is configured to connect the first set of conductors to a processing device for electrical communication with the display device to generate visual presentations using the display device.

18. The flexible printed circuit of claim 17, wherein the first interface at the first end of the flexible printed circuit is configured to connect to a display layer of the display device, the display layer comprising electronic components that define pixels of the display device.

19. The flexible printed circuit of claim 17, wherein the second set of conductors connect to the sensor at the sensor portion of the flexible printed circuit.

20. The flexible printed circuit of claim 17, wherein:
a front-facing surface of the sensor portion of the flexible printed circuit is configured to contact a rear-facing surface of the display device or layer behind the display device;
a rear-facing surface of the sensor portion of the flexible printed circuit is configured to contact a front-facing surface of a component located behind the display device and the flexible printed circuit.

21. The flexible printed circuit of claim 17, wherein the sensor comprises two conductors separated from each other by a space, the conductors configured to be arranged to contact each other in response to pressure applied to at least one of the two conductors.

22. The flexible printed circuit of claim 21, wherein each of the two conductors is formed on a portion of a layer of the display device, the respective portion of the layer being oriented parallel to the display device.

23. The flexible printed circuit of claim 17, wherein the flexible printed circuit or a component to which it attaches is configured to wrap around at least part of an edge portion of the display device to connect to a display layer of the display device that comprises electronic components that define pixels of the display device.

\* \* \* \* \*